United States Patent [19]

Sanders et al.

[11] Patent Number: 5,263,188
[45] Date of Patent: Nov. 16, 1993

[54] FADE COMPENSATED TONE CONTROL METHOD AND APPARATUS

[75] Inventors: Eric A. Sanders, Sheridan, Ind.; Dale L. Morse, Riverview, Mich.

[73] Assignee: Delco Electronics Corporation, Kokomo, Ind.

[21] Appl. No.: 745,787

[22] Filed: Aug. 16, 1991

[51] Int. Cl.$^5$ .............................................. H03G 9/00
[52] U.S. Cl. .................................... 455/267; 455/345; 381/86; 381/101
[58] Field of Search ...................... 455/233.1, 267, 268, 455/345, 350, 200.1; 381/24, 86, 101–104, 107, 109

[56] References Cited

U.S. PATENT DOCUMENTS

| | | | |
|---|---|---|---|
| 4,903,307 | 2/1990 | Ozawa et al. | 381/103 |
| 5,046,106 | 9/1991 | Liebel et al. | 381/102 |

FOREIGN PATENT DOCUMENTS

| | | | |
|---|---|---|---|
| 0416277 | 3/1991 | European Pat. Off. | 381/103 |
| 0079506 | 3/1990 | Japan | 381/103 |
| 0007412 | 1/1991 | Japan | 381/103 |
| WO86/06568 | 6/1986 | World Int. Prop. O. | |

Primary Examiner—Reinhard J. Eisenzopf
Assistant Examiner—Chi Pham
Attorney, Agent, or Firm—A. Frank Duke; Anthony Luke Simon

[57] ABSTRACT

A vehicle radio having a microprocessor based control has bass and treble tone controls and a fade control to produce digital settings. A tone adjusting arrangement compensates for the effect of fade change on perceived tone or frequency response. Tables of compensation values stored in a ROM and addressed by fade settings are used to change the nominal tone settings. The tone setting combined with the compensation value provides an adjusted or compensated tone value to maintain a consistent tone when fade is adjusted.

7 Claims, 3 Drawing Sheets

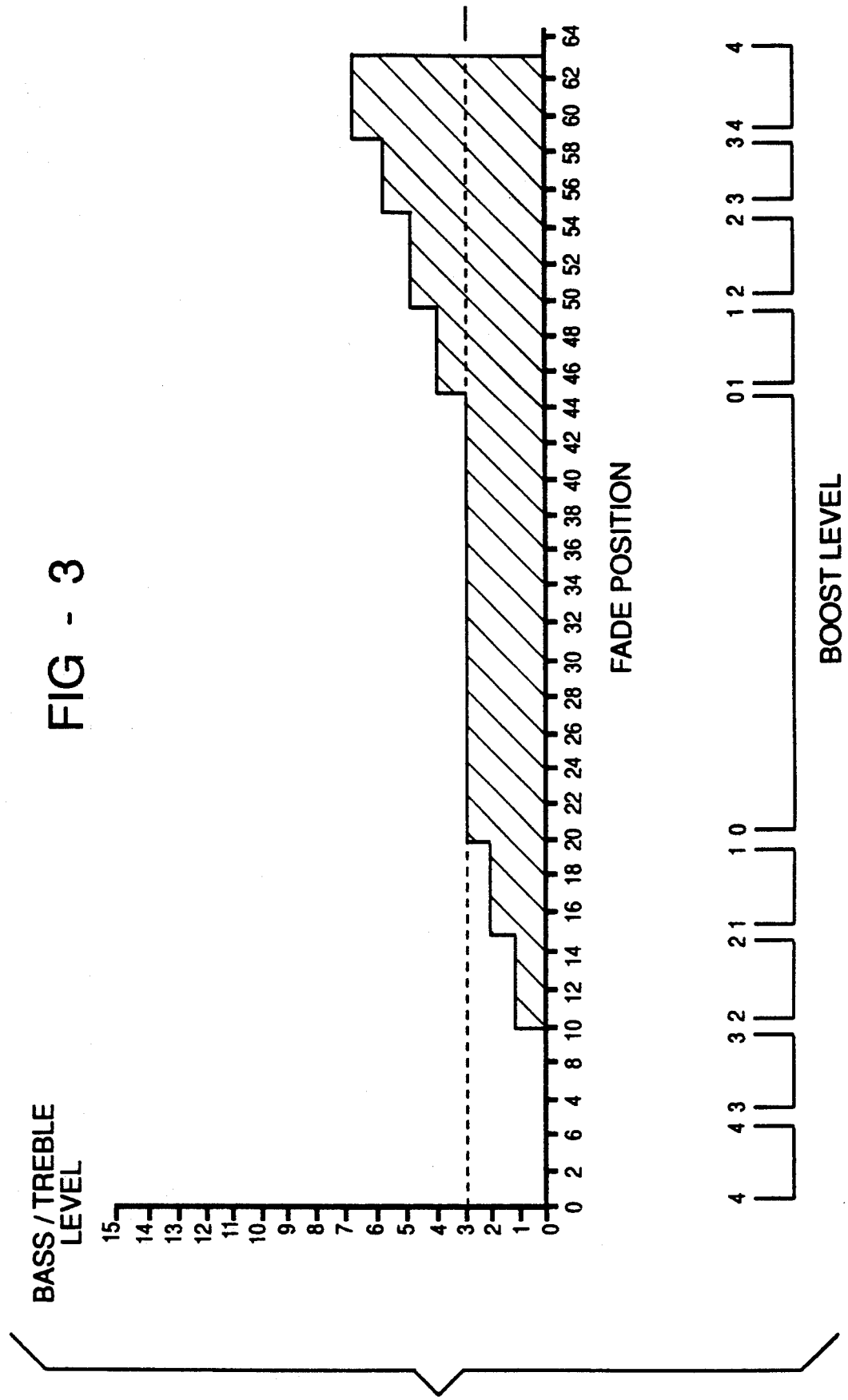

FADE COMPENSATED TONE CONTROL METHOD AND APPARATUS

FIELD OF THE INVENTION

This invention relates to a microprocessor based control for a sound system and particularly to a method and apparatus which compensates tone for the effect of fade settings.

BACKGROUND OF THE INVENTION

Sound systems installed in automotive vehicles are typically equipped with controls for adjusting tone, either by bass and treble controls or by multi-channel equalizers, to adjust the sound characteristics to the preference of the operator. Thus a certain amount of balance of frequency ranges is attained. Where the vehicle is equipped with front and rear speakers, a fade control is used to apportion the sound volume between the front and rear. When fade is changed, the balance of the frequency ranges is often changed as well, depending on the acoustical response characteristics of the vehicle. This causes the operator to adjust the bass/treble settings manually upon each fade operation to maintain a consistent sound.

To overcome drastic changes in the frequency response due to fade changing it is sometimes attempted to design a "flat" response in a given style of vehicle by redesign of speakers, the acoustical housing, electronic hardware, and speaker location. Such customizing is expensive and takes considerable time.

Present vehicle radio systems tend to use microprocessor control technology and thus have the capability of calibrating various functions by software design. It is desirable then to use software calibration rather than hardware changes to customize the frequency response of a system for a given vehicle to meet user expectations thereby achieving a new level of flexibility in audio system design at minimal or no extra expense.

SUMMARY OF THE INVENTION

It is therefore an object of the invention to apply software techniques to compensate for the effect of fade change on the perceived frequency response of the vehicle sound system.

The invention is carried out in a vehicle sound system having front and rear speakers and a fade control to apportion the sound volume between front and rear, wherein the bass and treble response at a given location in the vehicle is subject to change due to fade adjustment, by means for compensating for the effect of fade adjustment comprising: a circuit for operating speakers; manually operated tone control input means for selecting a tone setting; manually operated fade control input means for selecting a fade setting; a microprocessor control for the circuit responsive to tone and fade settings, the control including tables of tone compensation values addressed by fade setting, whereby for each fade setting the control identifies compensation values and outputs a tone control signal as a function of the tone settings and the compensation values.

The invention is further carried out in a microprocessor controlled vehicle sound system having front and rear speakers, a tone control generating tone settings, and a fade control generating a fade signal to apportion the sound volume between front and rear, wherein the tone at a given location in the vehicle is subject to change due to fade adjustment, by the method of compensating for the effect of fade adjustment comprising the steps of: providing tables of compensation values addressed by fade settings; sampling the fade signal; looking up compensation values for the fade setting; combining the compensation value with the tone settings to derive an adjusted tone signal; and controlling the speakers in accordance with the fade setting and the adjusted tone signal.

BRIEF DESCRIPTION OF THE DRAWINGS

The above and other advantages of the invention will become more apparent from the following description taken in conjunction with the accompanying drawings wherein like references refer to like parts and wherein:

FIG. 3 is a graph illustrating the effect of fade position on compensated tone setting according to the invention.

DESCRIPTION OF THE INVENTION

Figure 1:
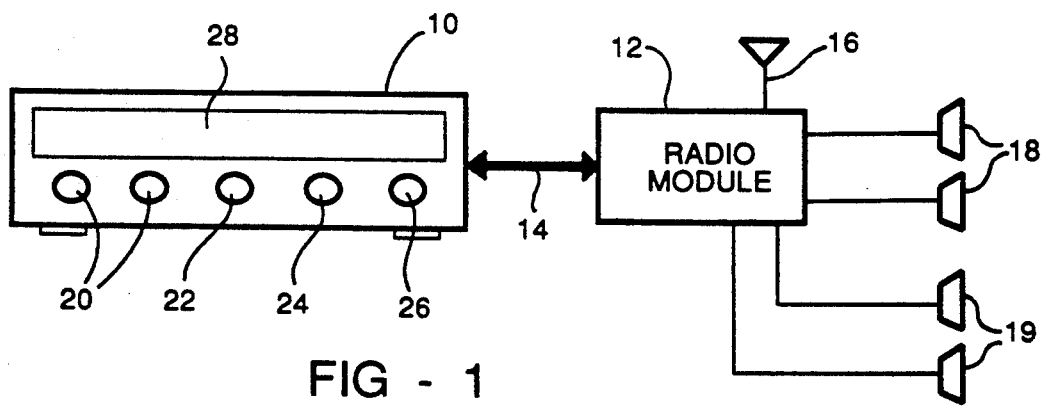
FIG. 1 is a schematic view of a prior art vehicle radio system adapted for use with the present invention.

Referring to FIG. 1, an automotive radio system includes a control head 10, a radio module 12 which is coupled to the head 10 by a data bus 14, an antenna 16 coupled to the module 12 and left and right speakers 18 and 19, respectively, also connected to the module. The module 12 or radio receiver has circuitry controlling the speakers in accordance with commands initiated at the head 10. The tuning of the module 12 as well as volume, bass, treble, fade and balance or other functions is controlled by the head 10 which sends control signals to the module 12 in the form of digital data via the bus 14. The head includes control knobs 20-26 or buttons for manual selection of each function and a display 28 which is used to show at least the chosen radio frequency but may also graphically depict the volume, bass/treble settings and fade setting in addition to time. It should be understood that tone control other then bass/treble controls may be used; for example, a multi-channel equalizer may provide the tone settings.

Digital signals carried by the bus 14 communicate to the module 12 any settings or changes input by operator adjustment of knobs 20-26. The signal for fade control, for example is a number from 0 to 63 with high numbers corresponding to a higher volume at the rear speakers and low volume at the front speakers. Thus by changing the digital fade signal the head commands the module to change the front and rear volume accordingly. The same method is used for control of tone, or bass/treble settings. The digital signals for either bass or treble are numbers from 0 to 15, with 15 being the greatest emphasis for that frequency range.

The head 10 and the module 12 each have a microprocessor programmed to manage the head function and module function, respectively, as well as the communications over the bus 14. The signals sent by the head to the module may be of two types; either a number for a setting which the module must conform to or a command to increment or decrement the existing setting. After executing a command from the head, the module sends a status report over the bus to indicate the new value.

Figure 2:
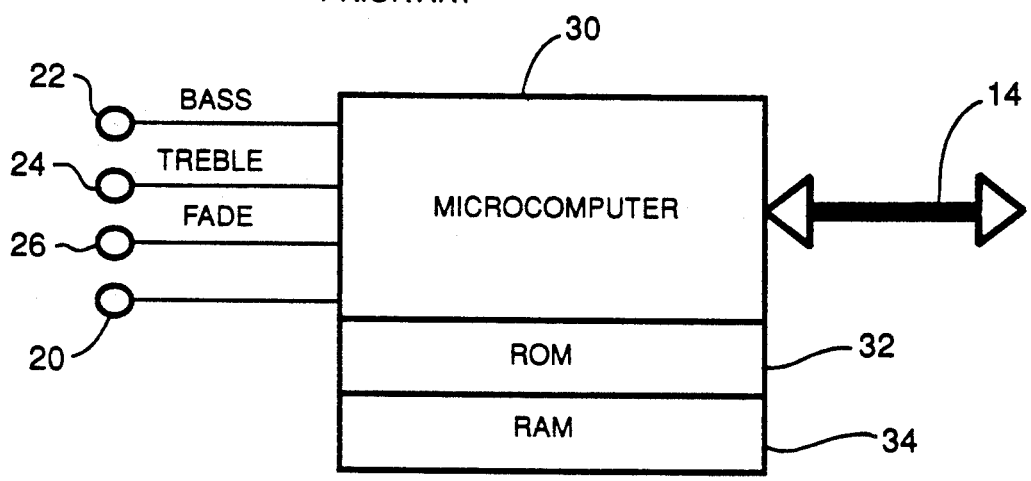
FIG. 2 is a schematic diagram of a microprocessor and controls for use in the system of FIG. 1 with provision to accommodate the invention.

FIG. 2 shows the microprocessor 30 for the head which has inputs from the control knobs 20-26 and inputs as well as outputs on bus 14. A ROM 32 permanently stores certain control parameters for use by the microprocessor and a RAM 34 is used for calculations and to store variables. A portion of the RAM, called a keep alive memory, is maintained even when the vehicle ignition is turned off by supplying voltage from the battery. The selected radio settings are stored in the keep alive memory so that when the ignition is turned on the radio settings will be the same as when the vehicle was last used.

To compensate the tone for changes in fade, the microprocessor is programmed to adjust the tone for the fade setting. By empirically making such adjustments in a vehicle, a table of desired adjustments for the desired compensation can be compiled and stored in the ROM. Different table may be used for bass settings and treble settings, and indeed different sets of tables could be used for various conditions such as high or low tone settings. A typical table is as follows:

| FADE  | COMPENSATION |
|-------|--------------|
| 0-4   | -4           |
| 5-9   | -3           |
| 10-14 | -2           |
| 15-19 | -1           |
| 20-44 | 0            |
| 45-49 | +1           |
| 50-54 | +2           |
| 55-58 | +3           |
| 59-63 | +4           |

The effect of tone compensation according to this table is shown in FIG. 3 which shows the bass or treble setting on the vertical scale and the fade position on the horizontal scale. A normal bass or treble level is three as shown by a horizontal line at that level. The tone is compensated at each fade setting according to the above table resulting in the stepped function shown by cross-hatching. Since the tone setting is three in this example, the boost of −4 is ineffective at the lowest fade settings. In this case the same compensation table is used for bass and treble but a different table can be used for each one.

Figure 4:
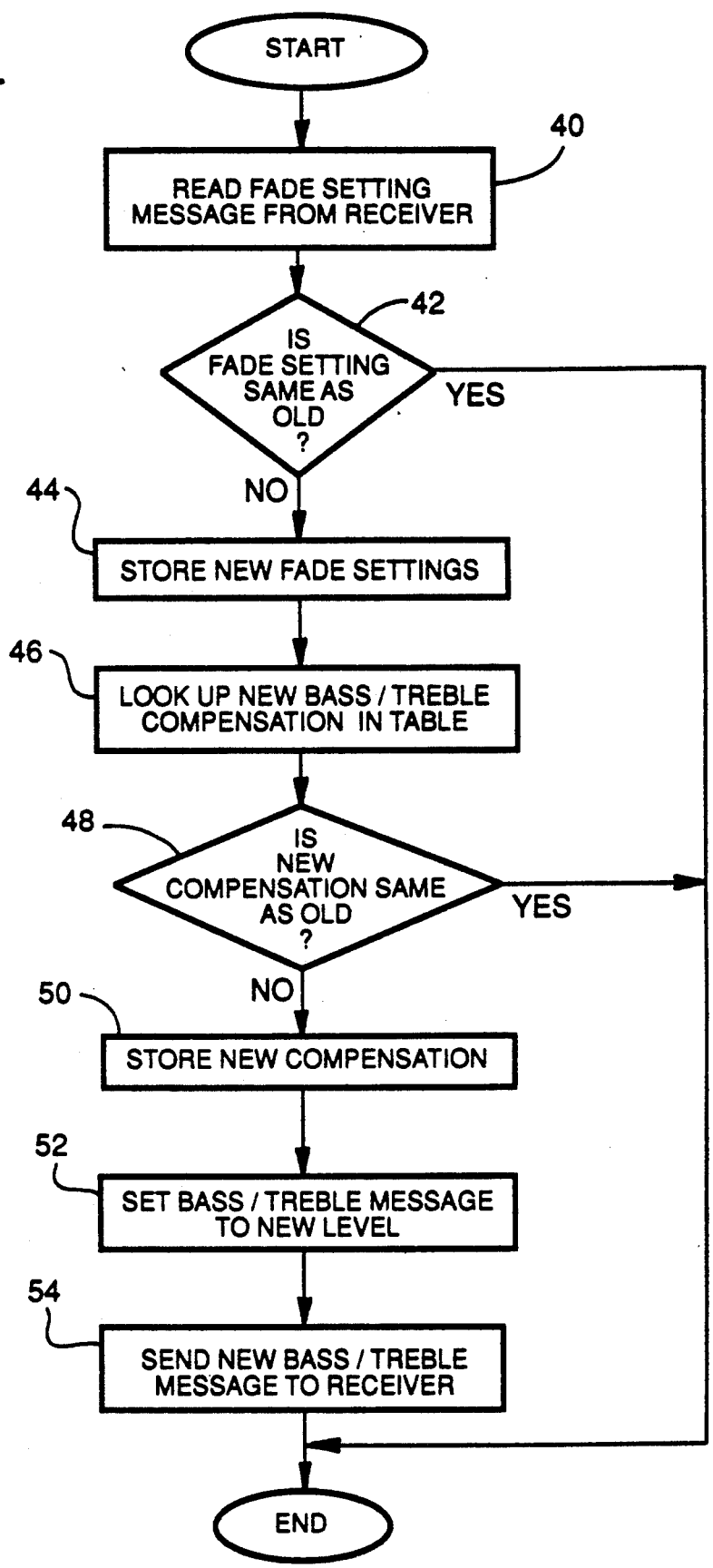

The flow chart of FIG. 4 represents a computer program which is used to detect a change of fade setting, look up the proper boost amount, and if the boost amount is different, send a new tone setting to the module 12. The program is run for treble compensation and then for bass compensation, but the bass/treble designation is used in the chart. In the flow chart description the reference numerals nn on the blocks are used in angle brackets <nn> to refer to the functions of the blocks. Here it is assumed that a fade setting change was sent to the module, the change was executed and the new fade setting was reported back to the head. In the compensation program the fade setting message is read <40>, and compared to the old setting <42>. If the setting is the same the program ends but if it is different, the setting is stored <44> for use in the next execution of this routine. Then the new compensation is looked up in the ROM table <46> and if it is the same as the old compensation value <48> the program ends but if it is different the new value is stored <50> and the bass or treble message is set to a new level <52> by summing the tone setting with the new compensation value and sent over the bus 14 to the receiver module <54>.

Figure 5:
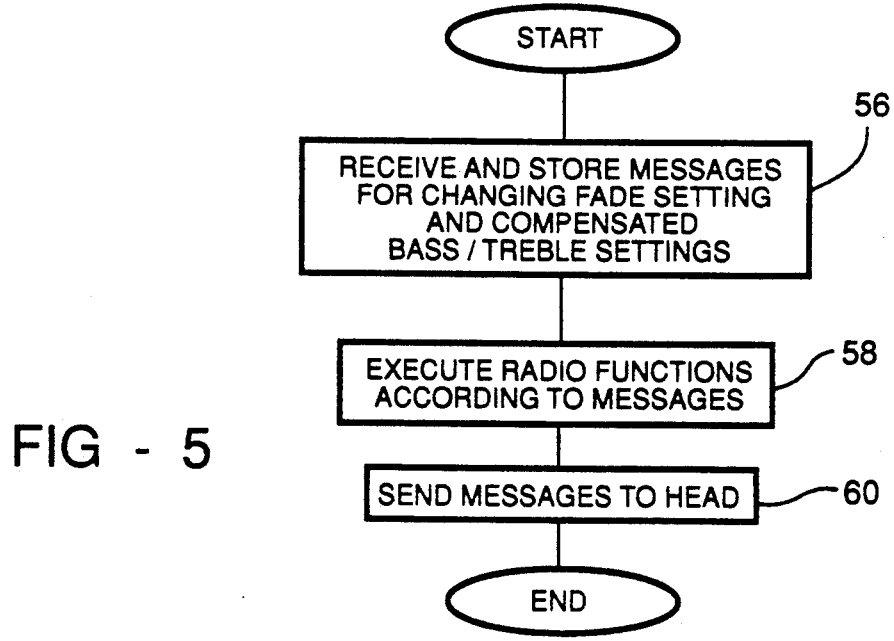
FIGS. 4 and 5 are flow charts illustrating the programs used to carry out the invention.

In the receiver module, as shown in the flow chart of FIG. 5, the messages to change fade setting and the compensated bass or treble setting are received and stored <56>, the radio function is executed pursuant to the message <58>, and messages of the resultant fade or tone status are sent to the head <60>.

It will thus be seen that the tone setting is readily adjusted or compensated for changes in fade and that the compensation program applies to any number of channels or frequency ranges that are subject to adjustment. It will be apparent that the invention applies to any microprocessor controlled sound system and is not limited to one having a separate head and receiver module. That is, an integrated radio unit can utilize the same program for tone compensation.

The embodiments of the invention in which an exclusive property or privilege is claimed are defined as follows:

1. In a vehicle sound system having front and rear speakers and a fade control to apportion the sound volume between the front and rear speakers, wherein the bass and treble response at a given location in the vehicle is subject to change due to fade adjustment, an apparatus comprising:

a circuit for operating speakers;
manually operated tone control input means for selecting a tone setting;
manually operated fade control input means for selecting a fade setting;
a microprocessor control for the circuit responsive to tone and fade settings, the control including tables of tone compensation values addressed by fade setting, whereby for each fade setting the control identifies compensation values and outputs a tone control signal as a function of the tone settings and the compensation values, and
wherein the circuit for operating speakers, the tone control input means, the fade control input means and the microprocessor control together comprise means for compensating for the effect of fade adjustment on the perceived frequency response of the vehicle sound system.

2. The invention as defined in claim 1 wherein the tone settings are digital values, and the compensation values are digital values which are summed with the tone settings to determine a tone control signal.

3. The invention as defined in claim 1 wherein the tone control comprises a bass control and a treble control for selecting bass and treble settings; and
the tables include a treble compensation table and a bass compensation table, whereby separate bass and treble compensation values are determined.

4. The invention as defined in claim 1 wherein the tone control comprises controls for a plurality of discrete frequency ranges for selecting a tone setting for each range; and
the tables include a table for each range whereby separate compensation values are determined.

5. In a microprocessor controlled vehicle sound system having front and rear speakers, a tone control generating tone settings, and a fade control generating a fade signal to apportion the sound volume between the front and rear speakers, wherein the tone at a given location in the vehicle is subject to change due to fade adjustment, a fade adjustment compensation method comprising the steps of:

providing tables of compensation values addressed by fade settings;

sampling the fade signal;

looking up compensation values for the fade setting;

combining the compensation value with the tone settings to derive an adjusted tone signal; and controlling the speakers in accordance with the fade settings and the adjusted tone signal to affect compensation for the effect of fade adjustment on the perceived frequency response of the vehicle sound system.

6. The invention as defined in claim 5 including providing separate tone settings for each of a plurality of frequency ranges, and providing a table of compensation values for each range.

7. In a microprocessor controlled vehicle sound system having front and rear speakers, a tone control generating tone settings and a fade control generating a fade signal to apportion the sound volume between the front and rear speakers, wherein the tone at a given location in the vehicle is subject to change due to fade adjustment, the method of compensating for the effect of fade adjustment comprising the steps of:

provlding tables of compensation values addressed by fade settings;

storing current values of fade setting and tone settings;

sampling the fade signal and comparing with the fade setting to detect a change;

when a fade change is detected, looking up new compensation values for the new fade setting; and if the new compensation values are different from current values, combining the new compensation values with the tone settings to derive an adjusted tone signal to affect compensation for the effect of fade adjustment on the perceived frequency response of the vehicle sound system.

* * * * *